United States Patent
Poulsen et al.

(10) Patent No.: US 10,755,721 B1
(45) Date of Patent: Aug. 25, 2020

(54) MULTICHANNEL, MULTIRATE, LATTICE WAVE FILTER SYSTEMS AND METHODS

(71) Applicant: SYNAPTICS INCORPORATED, San Jose, CA (US)

(72) Inventors: Jens Kristian Poulsen, Kitchener (CA); Hari Hariharan, Irvine, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/399,927

(22) Filed: Apr. 30, 2019

(51) Int. Cl.
*G10L 19/008* (2013.01)
*H04S 3/00* (2006.01)

(52) U.S. Cl.
CPC ............ *G10L 19/008* (2013.01); *H04S 3/008* (2013.01); *H04S 2400/01* (2013.01)

(58) Field of Classification Search
CPC . G10L 19/0017; G10L 19/008; G10L 19/173; H03H 17/0283; H04R 2430/00
See application file for complete search history.

(56) References Cited

U.S. PATENT DOCUMENTS

| | | | |
|---|---|---|---|
| 6,792,057 B2 | 9/2004 | Kabel et al. | |
| 8,321,210 B2 | 11/2012 | Grill et al. | |
| 8,447,620 B2 | 5/2013 | Neuendorf et al. | |
| 2015/0010170 A1 | 1/2015 | Lindahl et al. | |

*Primary Examiner* — Kile O Blair
(74) *Attorney, Agent, or Firm* — Haynes and Boone, LLP

(57) ABSTRACT

Systems and methods for multichannel, multirate lattice wave filters receive digital signal channels at a first sample rate and include a first multiplexer to combine the digital signal channels into a first digital data stream, and a first lattice wave filter comprising a first delay elements and a first feedback path to the first multiplexer, the first lattice wave filter produces a first output digital data stream having a second sample rate that is different than the first sample rate. The first multiplexer is configured to receive a first feedback signal through the first feedback path and combine the first feedback signal with the digital signal channels to produce the first digital data stream. The system may include a first processing branch comprising the first multiplexer and the first lattice wave filter structure, and a second processing branch comprising a second multiplexer and a second lattice wave filter structure. This may enable the implementation of simplified filters of lower complexity by reuse of hardware.

20 Claims, 6 Drawing Sheets

MULTICHANNEL, MULTIRATE, LATTICE WAVE FILTER SYSTEMS AND METHODS

TECHNICAL FIELD

The present application relates generally to systems and methods for digital signal processing, and more particularly to sample rate conversion of digital samples, for example, in audio processing systems.

BACKGROUND

The conversion of digital signals to different sample rates suitable for various digital components and processes is well known. Digital signal processing systems use different sampling rates in various system components depending on a desired signal quality, noise density, required bandwidth, latency requirements, processing economy, available silicon area and other considerations. In conventional systems, cascaded integrator-comb (CIC), finite impulse response (FIR) and infinite impulse response (IIR) filters have been used to perform sample rate conversion, typically in multiple stages to save power, e.g., each successive stage will use a lower or higher sampling rate depending on whether the operation is decimation or interpolation. There is a continued need to lower the power consumption of sample rate conversion structures, lower delays within sample rate conversion structures, and lower the required silicon area for implementing sample rate conversion structures.

SUMMARY

In accordance with various embodiments, systems and methods disclosed herein provide multichannel, multirate lattice wave filters. Sample rate conversion of digital signals is performed in various applications and may include, for example, use of oversampled data converters or use of bridging between systems utilizing different sampling rates. The lattice wave filter solutions disclosed herein have lower silicon footprint as compared to conventional solutions. The lattice wave filter solutions disclosed herein also have lower power consumption and enable efficient changes in the coefficients.

Systems and methods for multichannel, multirate lattice wave filters receive digital signal channels at a first sample rate and include a first multiplexer to combine the digital signal channels into a first digital data stream, and a first lattice wave filter comprising a first delay elements and a first feedback path to the first multiplexer, the first lattice wave filter produces a first output digital data stream having a second sample rate that is different than the first sample rate. The first multiplexer is configured to receive a first feedback signal through the first feedback path and combine the first feedback signal with the digital signal channels to produce the first digital data stream. The system may include a first processing branch comprising the first multiplexer and the first lattice wave filter structure, and a second processing branch comprising a second multiplexer and a second lattice wave filter structure. The new system may lower complexity by reuse of hardware by implementing multiple filters sections using a single reflector stage.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Various embodiments of the present disclosure are directed to improved systems and methods for sample rate conversion of digital signals. The solutions disclosed herein allow for a lower silicon footprint as compared to previous solutions. In some embodiments, multichannel lattice wave filters are disclosed that have lower power consumption than conventional solutions and facilitate efficient changes in the coefficients.

Lattice wave filters have structures that are suited for decimation and interpolation. These filters have low sensitivity towards coefficient changes and thereby enable multiplications to be implemented with shorter coefficient length or may be replaced by addition and subtraction using canonic signed digit representation.

In various embodiments, multiple delays are included inside the lattice wave filters to enable multiple channels to be processed by the same filter. By multiplexing multiple channels into a single filter structure, a reduction in the number of coefficients, multipliers and adders needed to implement a particular structure are achieved. A feedback path is provided allowing a single reflector section of the lattice wave structure to implement multiple sections without requiring extra multipliers. The feedback structure further enables multiple filter sections to be combined into a single processing unit. The feedback path may support an input value of zero that further enables support of interpolation in the processing path.

Various embodiments will now be described in further detail with reference to the figures. As shown in figures, various degrees of simplification of the basic combination of multiple sections may be used, thereby implementing multiple channels, multiple sections, multiple sampling rates or even by implementing sections utilizing oversampling in some or more sections for lower latency. Oversampled low latency wave filters are described, for example, in application Ser. No. 16/177,308, filed Oct. 31, 2018 and titled "Low Delay Decimator and Interpolator Filters," which is incorporated by reference herein in its entirety.

Figure 1:
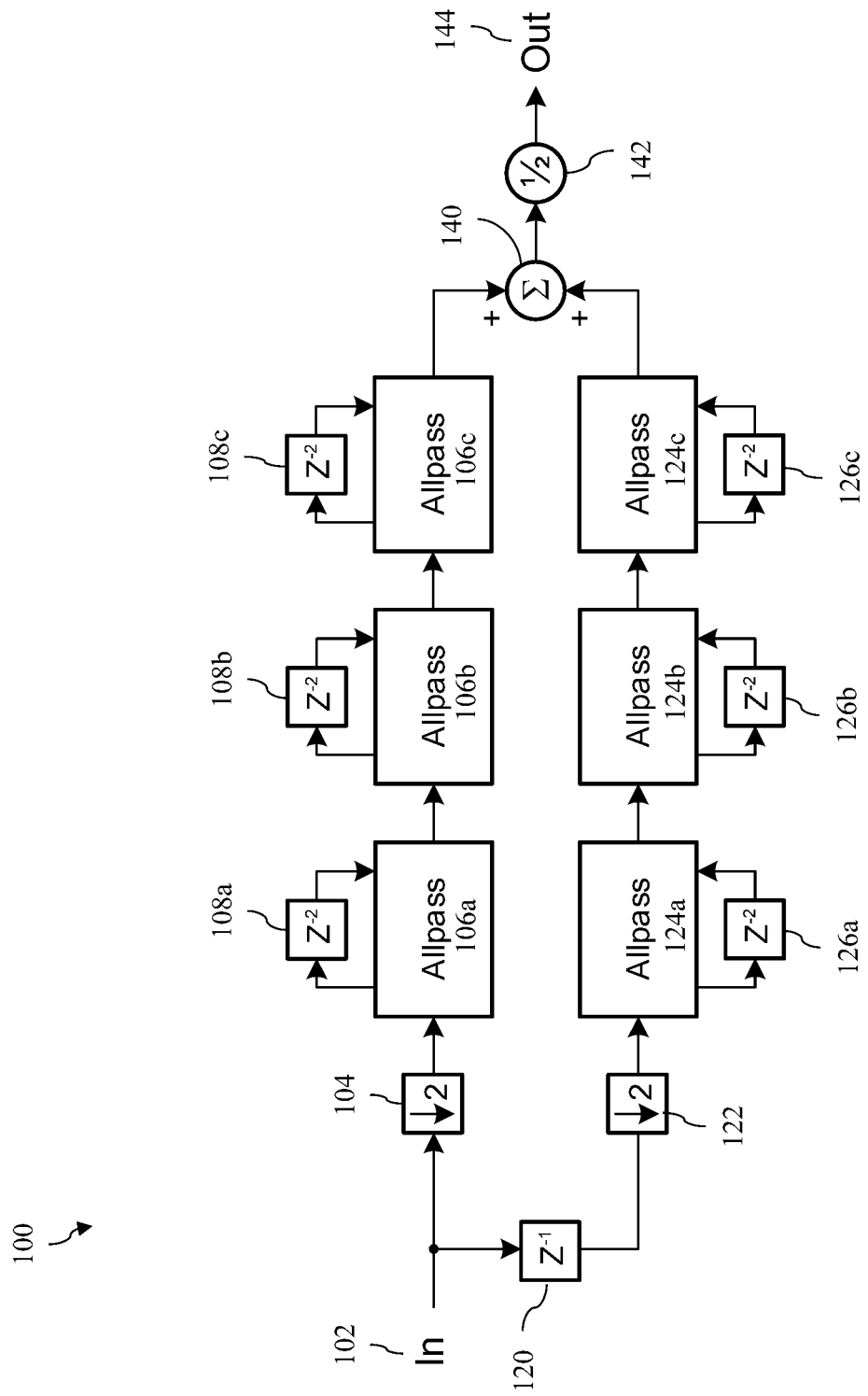
FIG. 1 illustrates a conventional multi-section lattice wave filter.

A multi-section lattice wave filter 100 will now be described with reference to FIG. 1. An input channel 102 (In) is configured to receive a digital input signal. In one embodiment, the input signal is a digital audio signal and multi-section lattice wave filter 100 is implemented in an audio signal processing unit. A first filter path includes a downsampler 104 and a plurality of all pass filters 106a-c. In the illustrated embodiment, the downsampler 104 receives the digital input signal, downsamples the digital input signal by a factor of 2, and outputs a downsampled signal to all-pass filter 106a. The all-pass filters include digital signal filters that pass all frequencies equally in terms of gain or magnitude but change the phase relationship among various frequencies. Each of the allpass filters 106a-c includes a corresponding delay element 108a-c. In the illustrated embodiment, each of the delay elements 108a-c is a two-sample delay element disposed in a feedforward arrangement. The filtered output of allpass filter 106a is fed to allpass filter 106b/delay element 108b and allpass filter 106c/delay element 108c to produce the first filtered output from the first filter path.

The second filter path includes a delay element 120, a downsampler 122 and a plurality of allpass filters 124a-c, each having a corresponding delay element 126a-c. The digital input signal is delayed one sample by delay element 120, downsampled by a factor of 2 by downsampler 122 and filtered through the allpass filters 124a-c/delay element 126a-c pairs to produce a second filtered output from the second filter path. The first filtered output and second filtered output are combined in summation block 140 and fed through ½ divider 142 to produce an output signal through an output 144.

Figure 2:
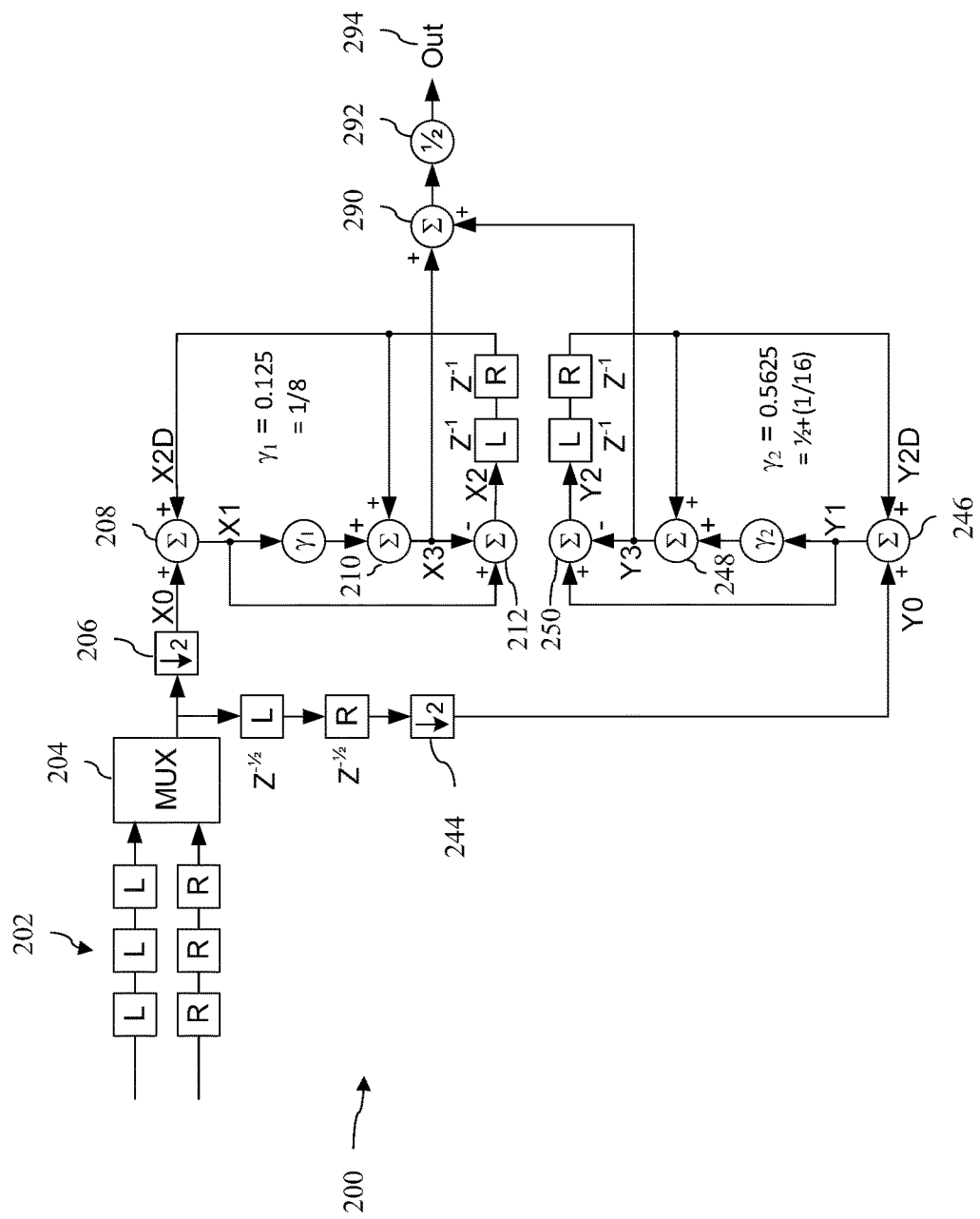
FIG. 2 illustrates an example two channel decimation filter unit utilizing multiple registers and an oversampled input, in accordance with one or more embodiments of the present disclosure.

FIG. 2 illustrates an example two channel decimation filter 200 utilizing multiple registers and an oversampled input, in accordance with one or more embodiments of the present disclosure. The embodiment of FIG. 2 enables a single filter to simultaneously process two data streams. An input 202 of the decimation filter 200 receives two input channels L and R (such as left and right stereo audio signals) at a multiplexer 204. Multiplexer 204 combines the two-channel input into a single digital stream for further processing. In one embodiment, the left channel L and right channel R are combined to form a series of sample pairs. This is an example of a fifth order lattice wave decimation filter processing two input streams simultaneously.

This filter consists of two reflector sections, namely the upper reflector including elements 208, 210, and 212, and associated delays and coefficients and the lower reflector section including elements 250, 248, and 246, and associated delays and coefficients. The decimation filter 200 includes two data paths for processing the input digital stream. In a first processing path, the input digital stream is provided to a downsampler 206, which downsamples the input digital stream to produce an output X0. The signal X0 is combined with a feedback signal X2D through a first 208 producing a signal X1. Coefficient $\gamma_1$, which has a value of 1/8 (0.125) in the illustrated embodiment, is applied to X1 and the result is added by a second adder 210 to feedback signal X2D to produce output signal X3. X3 is subtracted from X1 by a second subtractor 212 to produce a difference signal X2. The difference signal X2 is delayed one sample and fed back to the first adder 208 and the second adder 210.

In the second processing path, the input digital stream is downsampled by a factor of 2 by downsampler 244 to produce an output Y0. The signal Y0 is combined with a feedback signal Y2D through a third adder 246 producing signal Y1. Coefficient $\gamma_2$, which has a value of 1/16 plus one half (0.5625) in the illustrated embodiment, is applied to Y1 and the result is added by a fourth adder 248 to feedback signal Y2D to produce output signal Y3. Y3 is subtracted from Y1 by a second subtractor 250 to produce a difference signal Y2. The difference signal Y2 is delayed one sample and fed back to the third adder 246 and the fourth adder 248. The output signal X3 from the first processing path and output signal Y3 from the second processing path are combined by a fifth adder 290, fed through a first divider 292 and an output node 294 (OUT).

Figure 3:
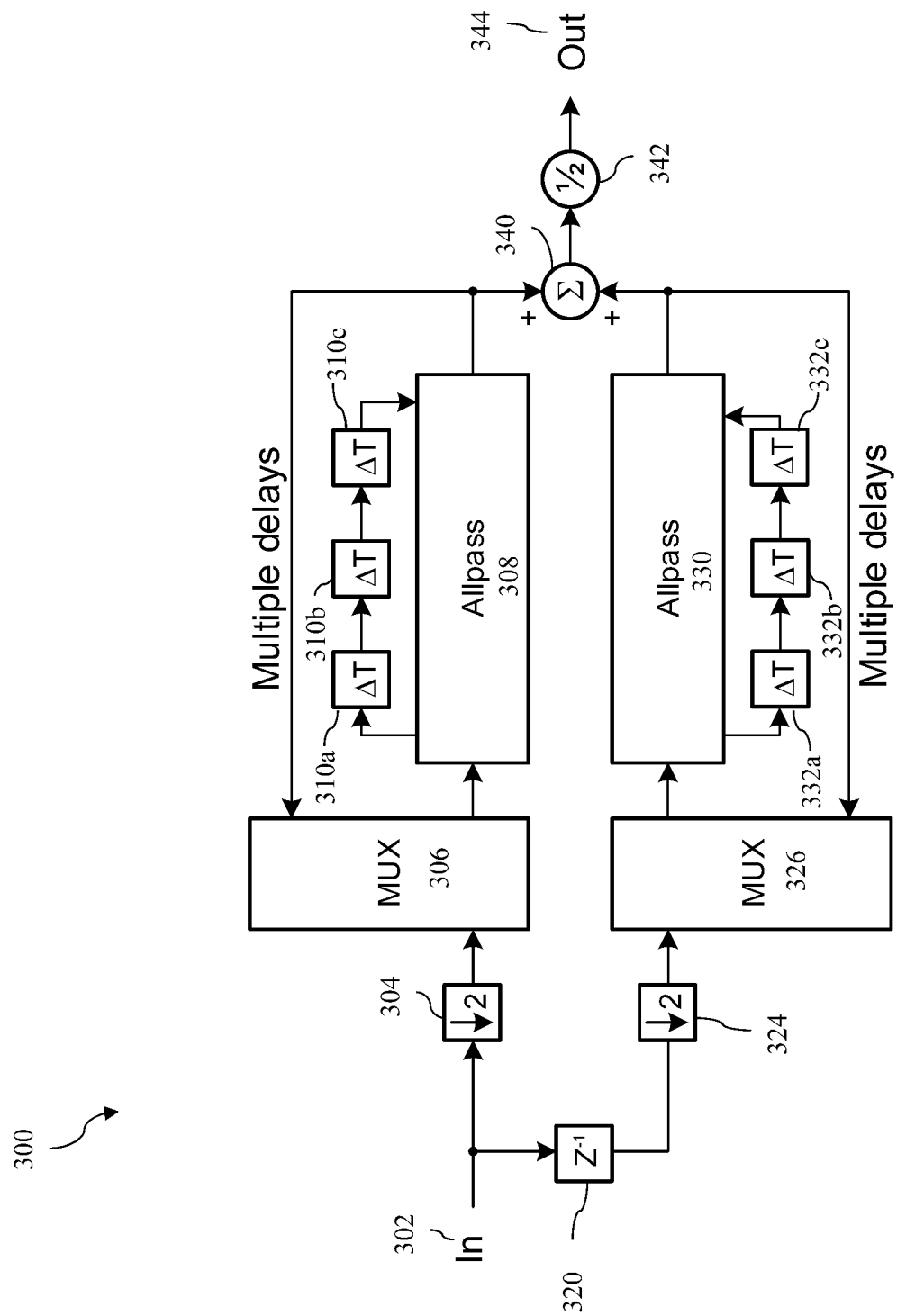
FIG. 3 illustrates an example single reflector using feedback, in accordance with one or more embodiments of the present disclosure.

Referring to FIG. 3, an example of a single filter 300 using feedback, in accordance with one or more embodiments of the present disclosure, will now be described. The embodiment of FIG. 3 enables multiple filter sections to be implemented using a single simplified allpass filter. The single filter 300 includes an input 302 (In) configured to receive an input signal, which is provided to two processing branches. In a first processing branch, the input signal is provided to a first downconverter 304 to downconvert the input signal by a factor of 2 and provide the downconverted output to a first multiplexer 306. The multiplexer 306 provides the signal to an allpass filter 308 having multiple delay elements 310a-c. The output signal is fed back to the multiplexer 306 and provided as a first input to an adder 340. This means a single reflector section inside the allpass filters 308 and 330 may be used instead of multiple reflector sections, thereby reducing complexity considerably.

In a second processing branch, the input signal is first provided to a delay element 320 to delay the input signal by one sample. The delayed input signal is then provided to a second downconverter 324 to downconvert the delayed input signal by a factor of 2 and provide the downconverted output to a second multiplexer 326. The second multiplexer 326 provides the signal to an allpass filter 330 having multiple delay elements 332a-c. The output signal is fed back to the multiplexer 326 and provided as a second input to an adder 340. The adder 340 combines the first output signal and the second output signal. The combined output is provided to ½ divider 342 and then an output 344 (Out).

Figure 4:
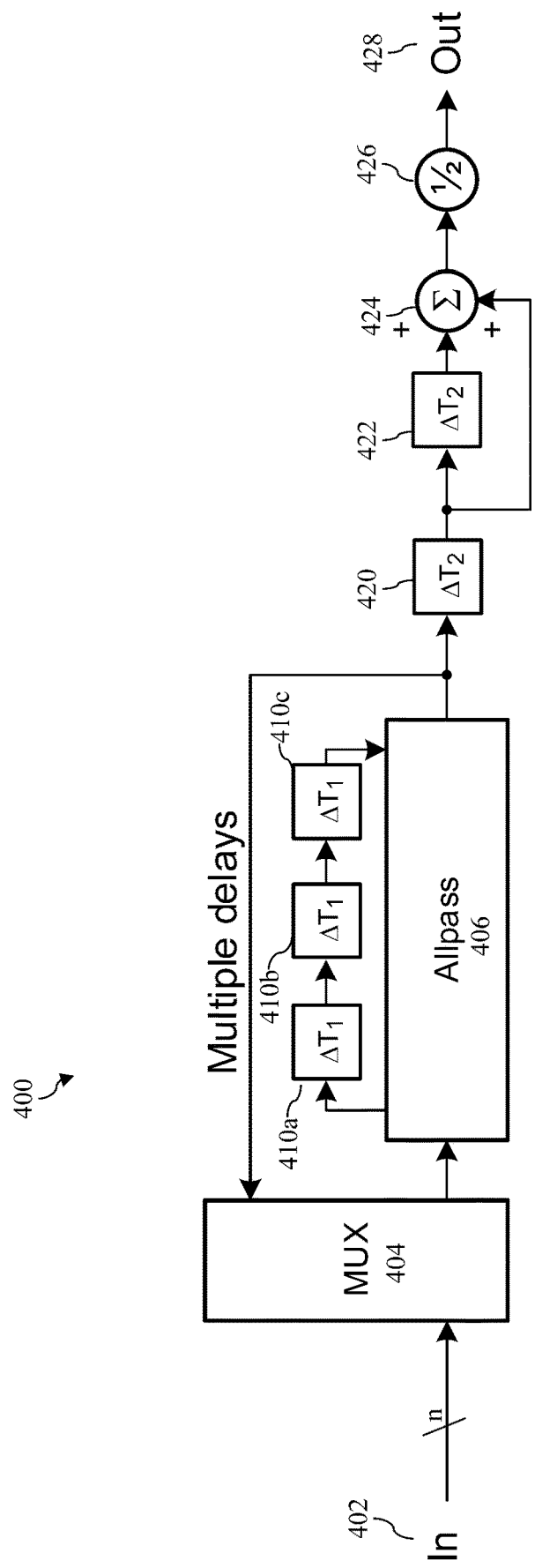
FIG. 4 illustrates an example multichannel, multirate, lattice wave filter, in accordance with one or more embodiments of the present disclosure.

FIG. 4 illustrates an example multichannel, multirate, lattice wave filter 400, in accordance with an embodiment of the present disclosure. The filter combines two allpass filters into a single section. The lattice wave filter 400 includes an input 402 configured to receive a digital input signal. The digital input signal is provided as an input to a multiplexer 404, along with a feedback signal. The multiplexer 404 outputs a digital stream to an allpass filter 406, which includes a plurality of delay elements 410a-c. The output of the allpass filter 406 is fed back to the multiplexer 404 and provided to an output stage comprising a first delay element 420 and a second delay element 422. The output from the first delay element 420 is provided to the second delay element 422 and an adder 424. The output from the second delay element 422 is combined with the output from the first delay element 420 in adder 424. The combined output is provided to ½ divider 426 and an output 428 (Out) of the lattice wave filter 400. This structure is a further refinement of FIG. 3 where FIG. 4 uses only a single reflector section to process all data.

Figure 5:
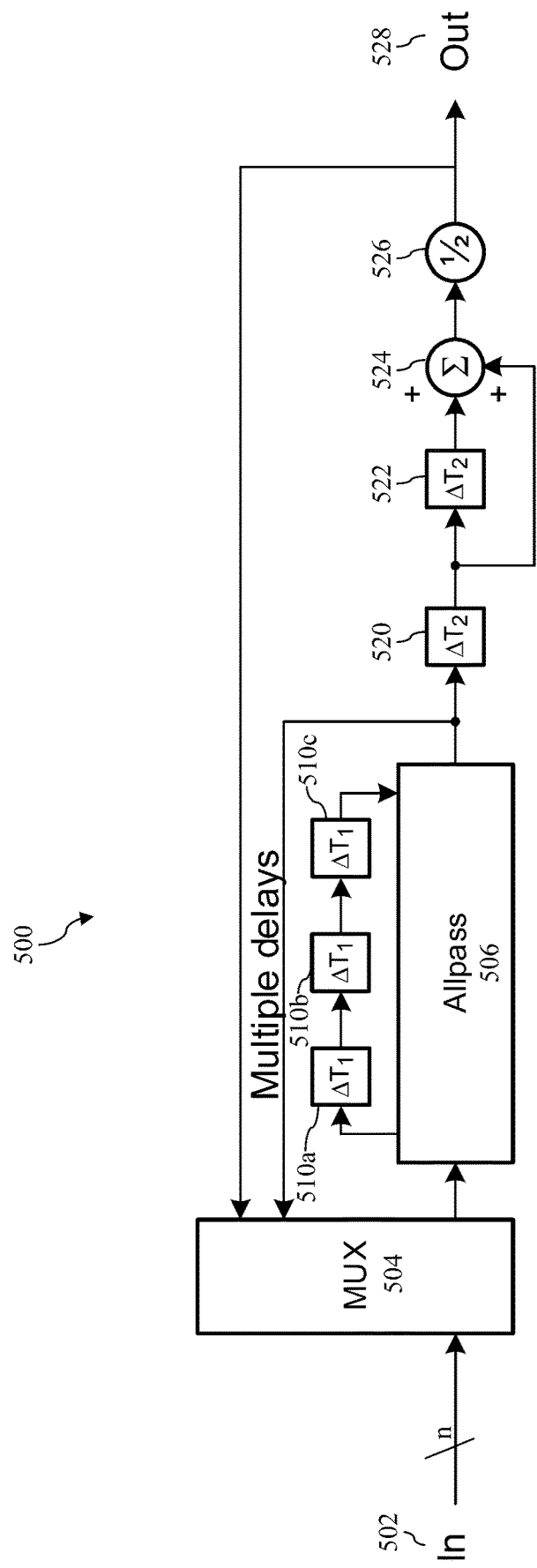
FIG. 5 illustrates a generalized, multirate, lattice wave filter, in accordance with one or more embodiments of the present disclosure.

FIG. 5 illustrates a generalized, multirate, lattice wave filter 500, in accordance with one or more embodiments of the present disclosure. This filter enables multirate signal processing with multiple sample rates using a single digital filter section thereby reducing complexity. The lattice wave filter 500 includes an input 502 receiving a digital input stream, which is fed to a multiplexer 504, along with a first feedback signal and a second feedback signal. The multiplexer 504 outputs to an allpass filter 506, including a plurality of delay elements 510a-c. The output of the allpass filter 506 is feedback to the multiplexer as the first feedback signal. The output of the allpass filter 506 is also provided to first delay element 520, which provides a first output to a second delay element 522 and an adder 524. The adder 524 combines the first output with a second output received from the second delay element 522. The combined signal is fed to a ½ divider 526 which produces an output signal provided to the output 528 (Out). The output signal is also feedback to the multiplexer 504 as the second feedback signal. This arrangement of an extra feedback node from 516 enables the implementation of multi-stage, multi-rate lattice wave decimation filters using a single reflector section (situated inside allpass filter 506). By adding a zero as an input option to the multiplexer 504, a multi-stage, multi-rate interpolator implemented in the same way. In other words, this figure can represent a complete interpolation or decimation signal processing chain with all processing happening using a single reflector stage inside 506.

The multichannel lattice wave filters disclosed herein may be used in a wide variety of applications. In various embodiments, the multichannel lattice wave filters disclosed herein may be implemented in echo cancellation and other multichannel audio processing systems to improve user experiences in noisy environments. In one approach a multichannel audio input/output device, such as headphones, headsets, ear buds or loudspeakers, includes one or more audio sensors to pick up environmental sound waves and processing circuitry to generate a desired audio signal (e.g., by cancelling echo, or identifying a target audio source).

In some embodiments, multichannel lattice wave filters are used in multichannel echo cancellation systems that use oversampled converters. In one embodiment, delta-sigma analog-to-digital converters (ADCs) and digital-to-analog converters (DACs) are used for audio signal processing. As compared to Nyquist sample rate converters, delta-sigma converters utilize a higher sample rate and are generally cheaper to implement because they require less precision in the analog signal components. Therefore, both from a cost and processing perspective, it is often advantageous to perform the noise cancellation at a higher sample rate than required by the Nyquist criterion and this can be used to obtain a wider noise cancellation bandwidth. One complication with multi-rate signal processing is the possibility of increased latency. The multichannel lattice wave filters disclosed herein have a low sensitivity to coefficient changes and may be used to obtain simplified filter solutions that do not require multiplication.

Figure 6:
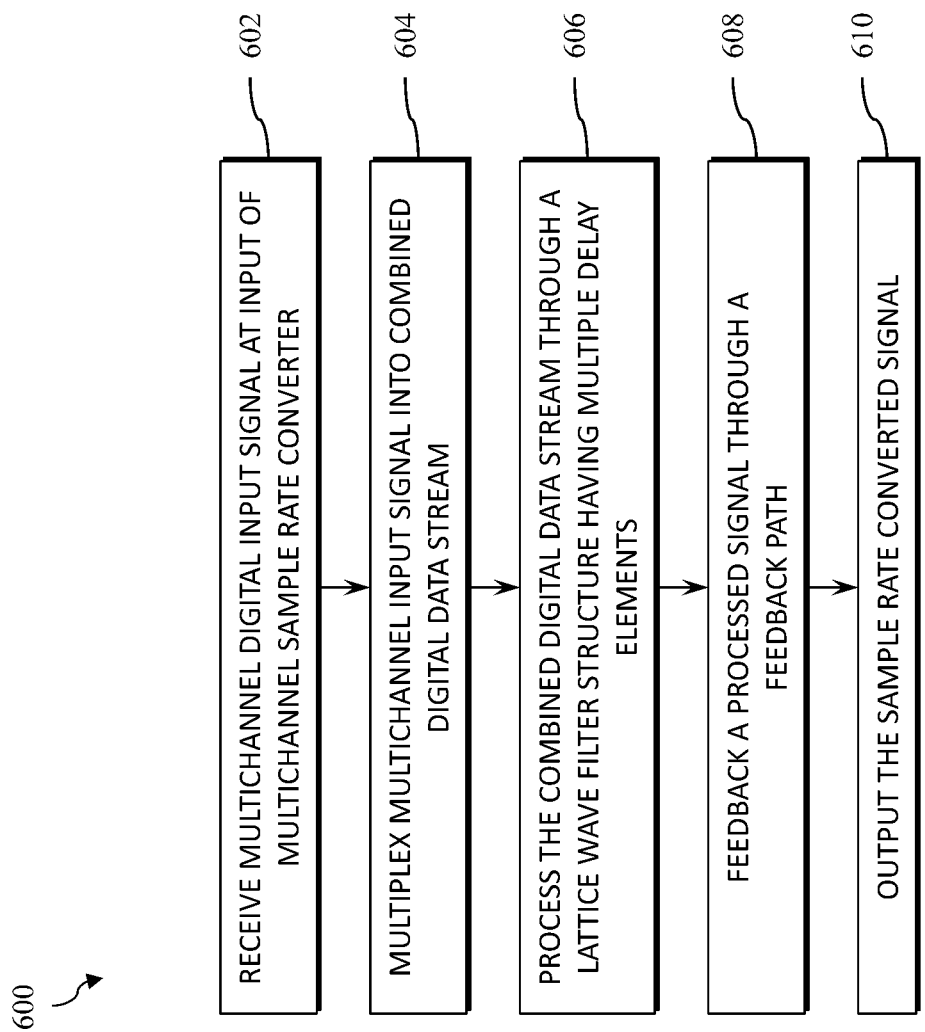
FIG. 6 illustrates a process for sample rate conversion of digital signals, in accordance with one or more embodiments of the present disclosure.

Referring to FIG. 6, an example process 600 for multichannel sample rate conversion is illustrated, in accordance with one or more embodiments of the present disclosure. In step 602, an input of the sample rate converter receives a multichannel digital input signal. The multichannel input signal may include any multichannel digital signal, such as a multichannel audio signal generated from a plurality of audio sensors. In step 604, the multichannel audio signal is multiplexed into a single data stream. In various embodiments, by multiplexing multiple channels into a single filter structure, a reduction in the number of coefficients, multipliers and adders needed to implement a particular structure are achieved.

In step 606, the combined digital data stream is processed through a lattice wave filter structure. The lattice wave filters may have lower power consumption than conventional solutions, facilitate efficient changes in the coefficients, and have lower silicon area compared to conventional systems. In some embodiments, the lattice wave filter structure enables multiple sample rates to be processed within a single section and may be used for decimation and interpolation. Multiple delays may be included inside the lattice wave filters to enable multiple channels of the combined digital data stream to be processed by the same filter. In some embodiments, the lattice wave filter structure includes two or more processing branches and the output from the two or more branches are combined before output.

In step 608, the processed signal is fed back through a feedback path. In some embodiments, the feedback path feeds the processed signal back to the multiplexer. In other embodiments, the feedback path is connected to a component in a respective processing branch. In step 610, the sample rate converted signal is output for further processing.

In the previous embodiments, particular structures of multichannel lattice wave filters have been presented. It will be appreciated by persons of ordinary skill in the art that other topologies of the disclosed multichannel lattice wave filters may be implemented without departing from the scope of the present disclosure.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. For example, although the low delay decimators and low delay interpolators disclosed herein are described with reference to adaptive noise cancellation systems, it will be appreciated that the low delay filters disclosed herein may be used in other signal processing systems. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
   an input configured to receive a plurality of digital signal channels having a first sample rate;
   a first multiplexer configured to combine the plurality of digital signal channels into a first digital data stream; and
   a first lattice wave filter structure comprising a first plurality of delay elements and a first feedback path to the first multiplexer, the first lattice wave filter structure configured to produce a first output digital data stream having a second sample rate that is different than the first sample rate;

wherein the first multiplexer is configured to receive a first feedback signal through the first feedback path and combine the first feedback signal with plurality of digital signal channels to produce the first digital data stream.

2. The system of claim 1, wherein the plurality of digital signal channels comprises a multichannel audio signal.

3. The system of claim 1, wherein the first digital data stream comprises a first stream of digital sample pairs.

4. The system of claim 1, wherein the system comprises an allpass filter structure.

5. The system of claim 1, comprising two processing branches, a first processing branch comprising the first multiplexer and the first lattice wave filter structure, and a second processing branch comprising:

a second processing branch delay element configured to delay the plurality of digital signal channels at least one sample and produce a delayed plurality of digital signal channels;

a second multiplexer configured to combine the delayed plurality of digital signal channels into a second digital data stream; and a second lattice wave filter structure comprising a second plurality of delay elements and a second feedback path to the second multiplexer, the second lattice wave filter structure configured to produce a second output digital data stream having the second sample rate;

wherein the second multiplexer is configured to receive a second feedback signal through the second feedback path and combine the second feedback signal with the plurality of digital signal channels to produce the second digital data stream.

6. The system of claim 5, further comprising an adder component configured to combine the first output digital data stream with the second output digital data stream.

7. The system of claim 6, further comprising a divider component configured to produce an output signal having the second sample rate.

8. The system of claim 1, further comprising a downsampler configured to receive the plurality of digital signal channels and downsample the plurality of digital signal channels before input to the first multiplexer.

9. The system of claim 1, wherein the system further comprises a decimator and the second sample rate is lower than the first sample rate.

10. The system of claim 1, wherein the system further comprises an interpolator and the second sample rate is higher than the first sample rate.

11. A method comprising:

receiving a multichannel digital input signal at an input of a multichannel sample rate converter;

combining the multichannel digital input signal into a first digital data stream;

processing the first digital data stream through a first lattice wave filter structure having a first plurality of delay elements;

feeding back a processed signal from the first lattice wave filter structure through a first feedback path; and outputting a first sample rate converted signal as a first output digital data stream.

12. The method of claim 11, wherein the multichannel digital input signal has a first sample rate and the output signal has a second sample rate that is different than the first sample rate.

13. The method of claim 11, wherein combining the multichannel digital input signal into a digital data stream comprises receiving the multichannel digital input signal as an input to a first multiplexer.

14. The method of claim 13, wherein feeding back the processed signal through the first feedback path comprises providing the processed signal as an input to the first multiplexer.

15. The method of claim 14, further comprising receiving at the first multiplexer the first feedback signal through the first feedback path and combining by the first multiplexer the first feedback signal with the multichannel digital input signal to produce the first digital data stream.

16. The method of claim 11, wherein the digital data stream comprises a first stream of digital sample pairs.

17. The method of claim 11, wherein the method is implemented in a circuit comprising an allpass filter structure.

18. The method of claim 11, wherein the lattice wave filter structure comprises a plurality of processing branches including a first processing branch comprising a first multiplexer and the first lattice wave filter structure, and a second processing branch, and wherein processing the second processing branch comprises:

delaying the multichannel digital input signal to produce a delayed plurality of digital signal channels;

combining the delayed multichannel digital input signal into a second digital data stream;

processing the second digital data stream through a second lattice wave filter structure having a second plurality of delay elements;

feeding back a second processed signal through a second feedback path; and outputting a second sample rate converted signal as a second output digital data stream.

19. The method of claim 18, further comprising combining the first output digital data stream with the second output digital data stream to produce a combined output digital data stream.

20. The method of claim 19, further comprising dividing the combined output digital data stream to produce an output signal having the second sample rate.

* * * * *